US007514971B2

(12) United States Patent
Lin

(10) Patent No.: US 7,514,971 B2
(45) Date of Patent: Apr. 7, 2009

(54) PULSE WIDTH MODULATION CURRENT ADJUSTMENT APPARATUS

(75) Inventor: Jyh Chain Lin, Tu-Chen (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 799 days.

(21) Appl. No.: 10/662,029

(22) Filed: Sep. 12, 2003

(65) Prior Publication Data

US 2004/0120699 A1 Jun. 24, 2004

(30) Foreign Application Priority Data

Dec. 20, 2002 (TW) .............................. 91136958 A

(51) Int. Cl.
*H03K 4/06* (2006.01)

(52) U.S. Cl. ...................................................... 327/131

(58) Field of Classification Search .................. 327/172
See application file for complete search history.

(56) References Cited

U.S. PATENT DOCUMENTS 3,621,282 A * 11/1971 Haas .......................... 327/132
4,452,210 A 6/1984 Sasayama et al.
5,631,817 A 5/1997 Minami
6,586,890 B2 7/2003 Min et al.

* cited by examiner

*Primary Examiner*—Lincoln Donovan
*Assistant Examiner*—Khareem E Almo
(74) *Attorney, Agent, or Firm*—Wei Te Chung

(57) ABSTRACT

The present invention provides a PWM current adjustment apparatus including a triangle wave generator (8) for generating a triangle wave voltage signal, a comparator (9), an FET (10), a power supply (14), a first resistor (11) and a second resistor (12). The triangle wave voltage signal generated by the triangle wave generator and a modulation signal provided by a modulation voltage source (13) are fed to the comparator, an output of the comparator is connected to a gate terminal of the FET, the power supply is connected to a source terminal of the FET through the first resistor, and a drain terminal of the FET outputs a driving current through the second resistor to a load.

2 Claims, 3 Drawing Sheets

PULSE WIDTH MODULATION CURRENT ADJUSTMENT APPARATUS

BACKGROUND OF THE INVENTION

1. Field of the Invention

The invention relatives to a current adjustment apparatus, more particularly, to a Pulse Width Modulation (PWM) current adjustment apparatus.

2. Description of The Related Art

A current adjustment apparatus is a common component in a driver circuit for a light emitting diode (LED). FIG. 4 represents a conventional current adjustment apparatus working in PWM (Pulse Width Modulation) mode. This current adjustment apparatus comprises a sawtooth wave generator 1, a comparator 2, a field effect transistor 3 (FET), a power supply 7, and current limiting resistors 4, 5. One input of the comparator 2 is connected to an output of the sawtooth wave generator 1, and the other input of the comparator 2 is connected to a modulation voltage source 6. The output of the comparator 2 is connected to a gate terminal of the FET 3. The current limiting resistor 4 is connected between the power supply 7 and a source terminal of the FET 3, and the resistor 5 is connected to a drain terminal of the FET 3.

Referring to FIG. 5, $V_{i1}$ is a modulation voltage signal provided by the modulation voltage source 6, $V_{r1}$ is a sawtooth wave signal provided by the sawtooth wave generator 1, and $V_{o1}$ is a voltage applied to the gate terminal of the FET 3. In use, the sawtooth wave signal $V_{r1}$ is compared with the modulation voltage signal $V_{i1}$ in the comparator 2. The comparator 2 outputs a positive level signal when the modulation voltage signal $V_{i1}$ is higher than the sawtooth wave signal $V_{r1}$, and the comparator 2 outputs a zero level signal when the modulation voltage signal $V_{i1}$ is lower than the sawtooth wave signal $V_{r1}$. The output level signal $V_{o1}$ is applied to the gate terminal of the FET 3, and the FET 3 outputs a current $I_{o1}$ to a load (not shown) through the resistor 5.

However, the conventional sawtooth wave generator 1 suffers from some disadvantages. Referring to FIG. 6, a circuit of the conventional sawtooth wave generator 1 is complex since it has two integral paths, i.e. a forward one D1-R3-C and a backward one C-R4-D2. Furthermore, considering a Fourier series expansion of a sawtooth wave signal:

$$V=(2/\pi)Vm[\sin wt-(1/2)\sin 2wt+(1/3)\sin 3wt \ldots +(-1)^{n-1}/n \sin(n)wt+ \ldots],$$

the Fourier series expansion reveals that a sawtooth wave signal V comprises both even harmonics and odd harmonics, and includes a considerable percentage of high frequency harmonics, which induces high frequency noise in the system and makes it difficult to built a high frequency sawtooth wave generator, and directly effects the stability of output current. In additional, to adjust the output driving current $I_{o1}$ in PWM mode, a frequency of the sawtooth wave signal $V_{r1}$ must be 10 times higher than that of the modulation voltage signal $V_{i1}$ in order to reduce unexpected harmonics in the output. A new current adjustment apparatus which solves these problems is desired.

SUMMARY OF THE INVENTION

One object of the present invention is to provide a PWM current adjustment apparatus with a less complex circuitry.

Another object of the present invention is to provide a PWM current adjustment apparatus which reduces high frequency noise and increases system stability.

The present invention provides a PWM current adjustment apparatus comprising a triangle wave generator for generating a triangle voltage signal, a comparator, a FET, a power supply, a first resistor used as a current limiting resistor, and a second resistor. In operation, the triangle wave voltage signal generated by the triangle wave generator and a modulation signal provided by a modulation voltage source are fed to the comparator, an output of the comparator is connected to a gate terminal of the FET, the power supply is connected to a source terminal of the FET through the current limiting resistor, and a drain terminal of the FET outputs a driving current through the second resistor.

Other objects, advantages, and novel features of the present invention will become more apparent from the following detailed description when taken in conjunction with the accompanying drawings.

DETAILED DESCRIPTION OF THE INVENTION

Figure 1:
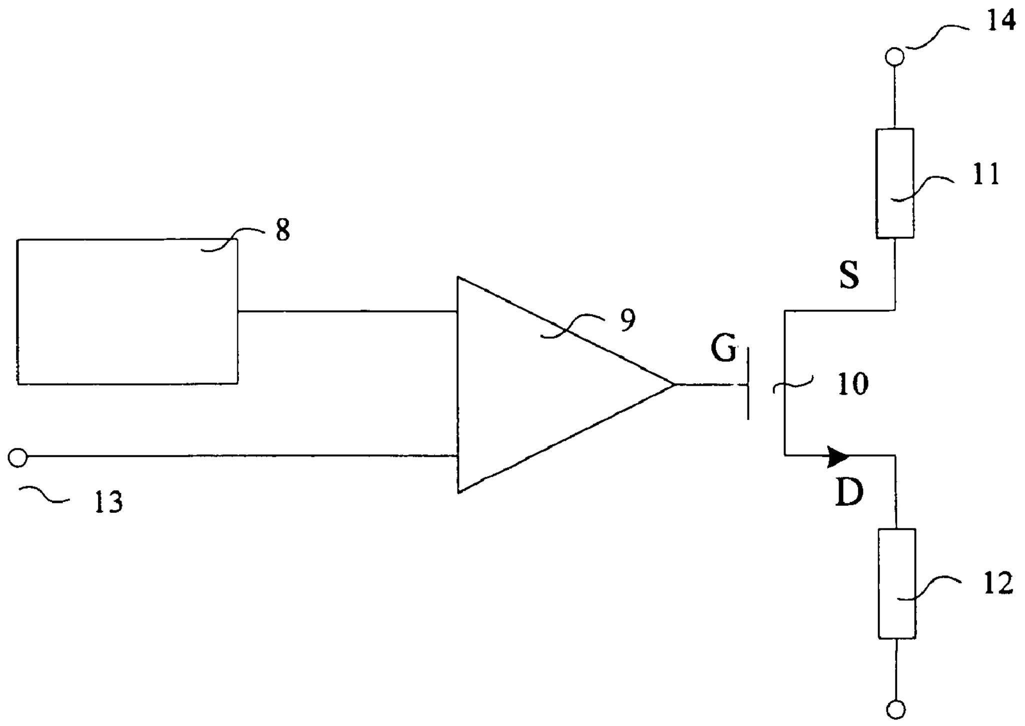
FIG. 1 is a circuit diagram of a PWM current adjustment apparatus of the present invention.
Figure 2:
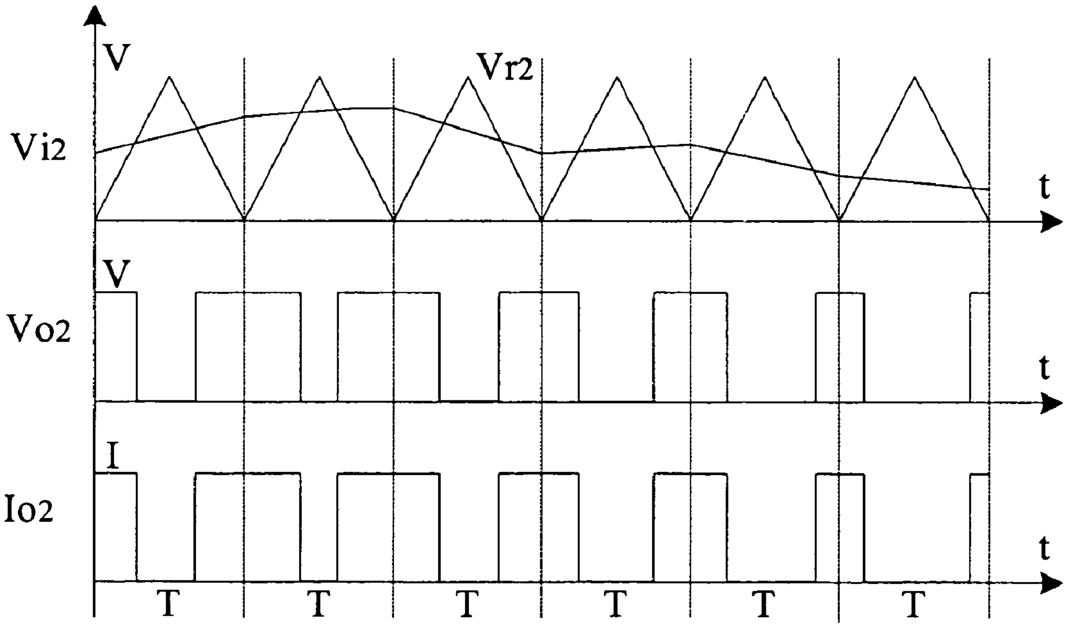
FIG. 2 illustrates waveforms of the particular PWM current adjustment apparatus shown in FIG. 1.

Referring to FIGS. 1 and 2, a PWM current adjustment apparatus of the present invention comprises a triangle wave generator 8, a comparator 9, an FET 10, a power supply 14, and two current limiting resistors 11, 12. A triangle wave signal $V_{r2}$ generated by the triangle wave signal generator 8 and a modulation signal $V_{i2}$ provided by a modulation voltage source 13 are compared in the comparator 9. The comparator 9 outputs a positive level signal when the modulation signal $V_{i2}$ is higher than the triangle wave signal $V_{r2}$, and outputs a zero level signal when the modulation signal $V_{i2}$ is lower than the triangle wave signal $V_{r2}$. An output signal $V_{o2}$ from the comparator 9 is applied to the FET 10, i.e. $V_{o2}$ is an input voltage at the gate terminal of the FET 10. The power supply 14 is connected to a source terminal of the FET 10 through one of the current limiting resistors 11. The FET 10 outputs a driving current $I_{o2}$ from its drain terminal for driving a load (not shown) through the other current limiting resistor 12.

The modulation signal $V_{i2}$ changes slowly in a period T of the triangle wave signal $V_{r2}$, and if the modulation signal $V_{i2}$ is higher than the triangle wave signal $V_{r2}$, the comparator 9 outputs a positive level signal and turns on the FET 10, generating a certain output driving current $I_{o2}$, which flows in the series loop of the power supply 14, the FET 10, the current limiting resistors 11, 12 and the load. If the modulation signal $V_{i2}$ is lower than the triangle wave signal $V_{r2}$, the comparator 9 outputs a zero level signal to turn off the FET 10, and there is no output current. Furthermore, the FET 10 can be an N-channel enhancement-type FET, a P-channel enhancement-type FET, an N-channel depletion-type FET, a P-channel depletion-type FET or any other type of switching component.

Figure 3:
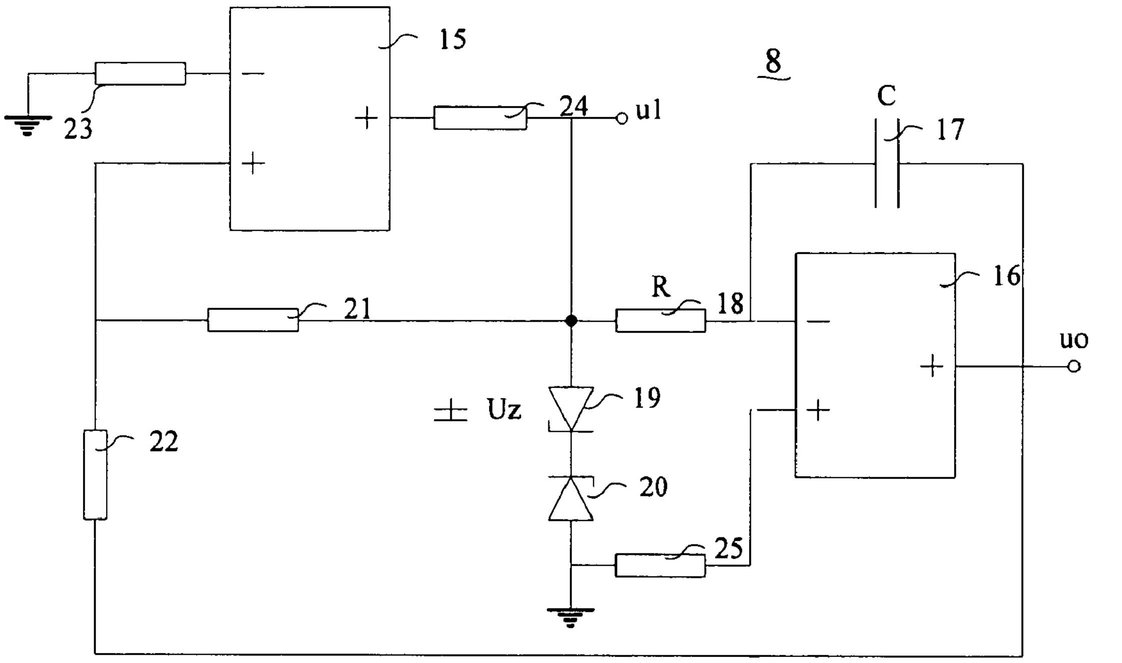
FIG. 3 is a circuit diagram of a triangle wave generator shown in FIG. 1.
Figure 4:
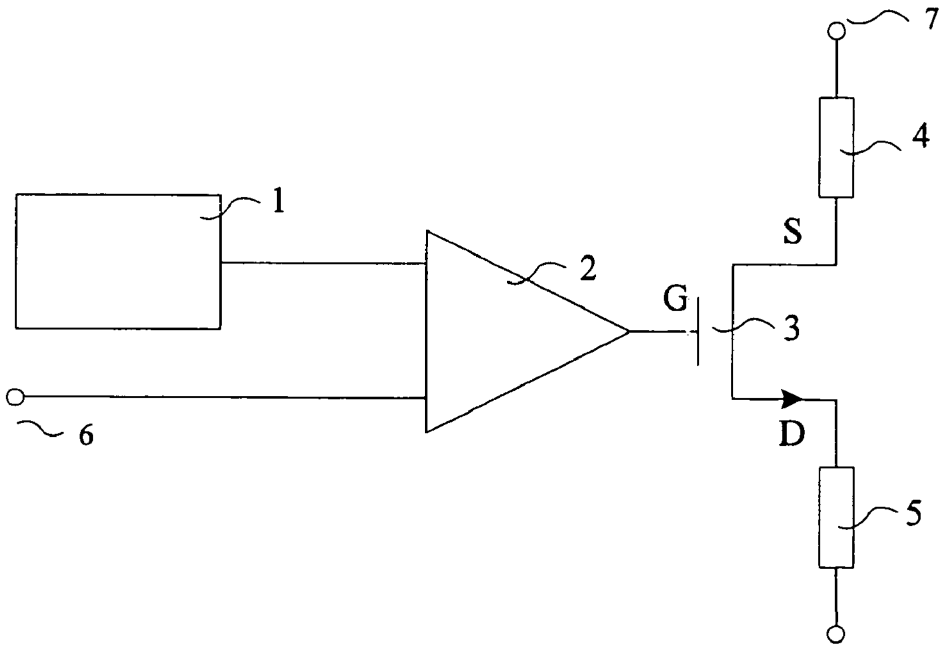
FIG. 4 (PRIOR ART)
FIG. 4 is a circuit diagram of a conventional PWM current adjustment apparatus.
Figure 5:
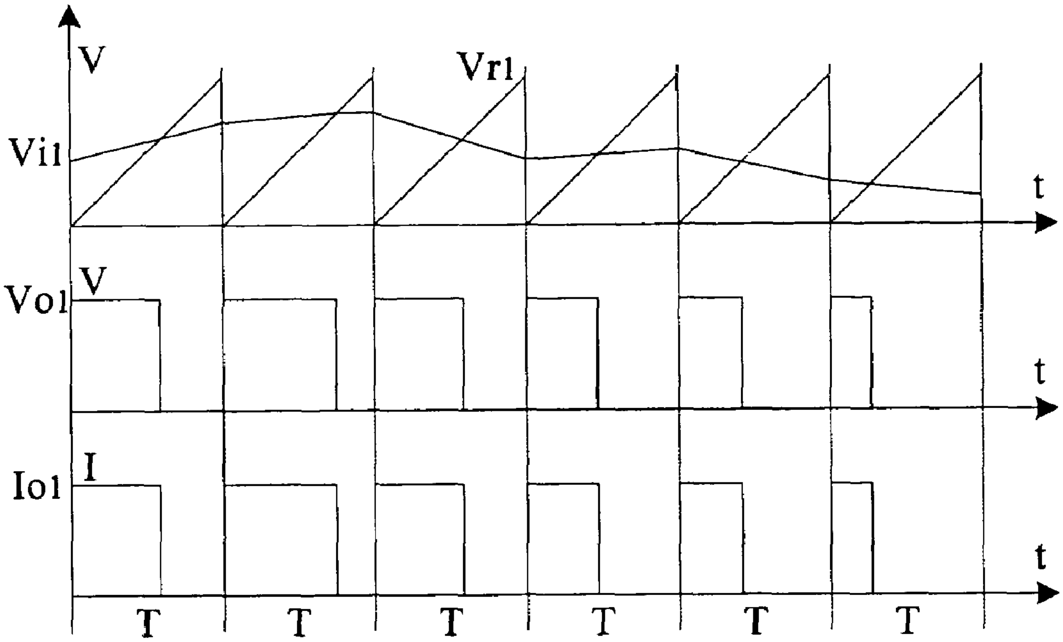
FIG. 5 (PRIOR ART)
FIG. 5 illustrates waveforms of a conventional PWM current adjustment apparatus shown in FIG. 4.
Figure 6:
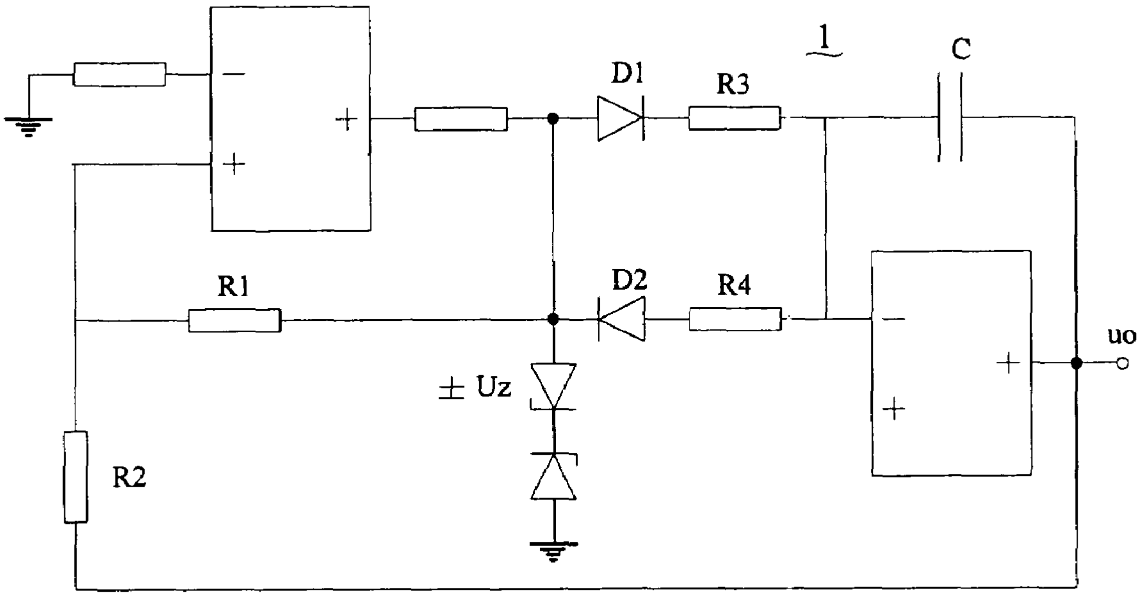
FIG. 6 (PRIOR ART)
FIG. 6 is a circuit diagram of a sawtooth wave generator shown in FIG. 4.

FIG. 3 shows a circuit diagram of the triangle wave generator 8 shown in FIG. 1. A front operational amplifier 15, a front grounding resistor 23, a first feedback resistor 21, a second feedback resistor 22 and a current limiting resistor 24 in combination form a zero-crossing comparator (not labeled). A second operational amplifier 16, a current limiting resistor 18, a capacitor 17 and a back grounding resistor 25 together form an integrator (not labeled). An inverting input terminal of the front operational amplifier 15 connects to ground through the front grounding resistor 23. A non-inverting input terminal of the front operational amplifier 15 connects to an output $u_1$ of the zero-crossing comparator through the first feedback resistor 21, and connects to an output $u_0$ of the operational amplifier 16 through the second feedback resistor 22. An anode terminal of a first zener diode 19 connects to the output $u_1$ of the zero-crossing comparator. A cathode terminal of the first zener diode 19 connects to a cathode terminal of a second zener diode 20, and an anode terminal of the second zener diode 20 connects to ground.

In use, the output u1 of the zero-crossing comparator is clamped to be a symmetric bipolar square wave by the zener diodes 19, 20. The integrator integrates the output $u_1$ of the zero crossing comparator, and outputs the desired triangle wave voltage signal $u_0$, i.e., the signal $V_{r2}$ shown in FIG. 2.

The circuit of the PWM current adjustment apparatus of the present invention is simple since it uses a single path. The Fourier series expansion for the symmetric triangle wave signal $V_{r2}$ is:

$$V=(8/\pi^2)Vm[\sin wt-(1/9)\sin 3\,wt+(1/25)\sin 5\,wt+\ldots+(-1)^{n-1}/(2n-1)^2\sin(2n-1)wt+\ldots].$$

Comparing this equation for the symmetric triangle wave signal $V_{r2}$ with the Fourier series expansion of the prior art sawtooth wave signal $V_{r1}$, note that the equation for the signal used in the present invention only comprises odd harmonics, no even harmonics. A coefficient of an Nth order harmonic of the symmetric triangle wave is $8/[\pi^2\times(2N-1)^2]$, which is much less in magnitude than that of a sawtooth wave signal, $2/(\pi\times N)$. In other words, the symmetric triangle wave signal includes smaller magnitude harmonic components, and induces lower noise as a result. All of these significantly increase system stability. And, it is thus easier and less costly to build a triangle wave generator than a sawtooth wave generator for high frequency operation.

In additional, the PWM current adjustment apparatus of the present invention is not limited to using the triangle wave generator described above. Other, more precise generators can be used in the PWM current adjustment apparatus of the present invention. A more precise triangle wave generator may be more complex than the triangle wave generator described above, but compared to more precise sawtooth wave generators, the triangle wave generator is still simpler, because of simple, integral circuit employed. And, in cases where the modulation voltage source signal amplitude is out of a range between a maximum and a minimum of a triangle wave signal, the current adjustment apparatus can either just keep comparing the modulation signal and the triangle wave signal in the comparator, or an auxiliary circuit may be added to obtain a desired function, according to the application requirement.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

The invention claimed is:

1. A triangle wave generator used in a pulse width modulation current adjustment apparatus, the triangle wave generator comprising:

a first operational amplifier;

a front resistor electrically connecting a negative terminal of the first operational amplifier to ground;

a first feedback resistor, a second feedback resistor and a first current limiting resistor electrically connected to a positive terminal of the first operational amplifier so as to form a zero-crossing comparator;

a second operational amplifier, a second current limiting resistor, a capacitor, and a back grounding resistor together forming an integrator;

the back grounding resistor electrically connecting a positive terminal of the second operational amplifier to ground; and an output of the first operational amplifier electrically connected to the positive terminal of the first operational amplifier via the first current limiting resistor and the first feedback resistor, an output of the second operational amplifier electrically connected to the negative terminal of the second operational amplifier via the capacitor and also electrically connected to the positive terminal of the first operational amplifier via the second feedback resistor, and the output of the second operational amplifier outputting a triangle wave voltage signal;

wherein the integrator comprising the back grounding resistor electrically connecting the positive terminal of the second operational amplifier to ground provides the triangle wave generator with the characteristic that the triangle wave voltage signal output by the second operational amplifier has a plurality of rising portions and a plurality of declining portions, with the triangle wave voltage signal consisting only of odd harmonics such that a percentage of high frequency harmonics of the triangle wave voltage signal is low.

2. A pulse width modulation current adjustment apparatus, comprising:

a triangle wave generator for generating a triangle wave voltage signal;

a modulation voltage source configured for providing a modulation voltage signal;

a comparator;

a field effect transistor;

a power supply;

a first resistor; and a second resistor;

wherein the triangle wave generator includes a first operational amplifier, a front resistor, a first feedback resistor, a second feedback resistor, a first current limiting resistor, a second operational amplifier, a second current limiting resistor, a capacitor, and a back grounding resistor;

the front resistor electrically connects a negative terminal of the first operational amplifier to ground;

the first feedback resistor, the second feedback resistor and the first current limiting resistor electrically connect to a positive terminal of the first operational amplifier so as to form a zero-crossing comparator;

the second operational amplifier, the second current limiting resistor, the capacitor and the back grounding resistor together form an integrator;

the back grounding resistor electrically connects a positive terminal of the second operational amplifier to ground;

an output terminal of the first operational amplifier electrically connects to the positive terminal of the first operational amplifier via the first current limiting resistor and the first feedback resistor;

an output terminal of the second operational amplifier electrically connects to a negative terminal of the second operational amplifier via the capacitor;

the output terminal of the second operational amplifier further electrically connects to the positive terminal of the first operational amplifier via the second feedback resistor;

the output terminal of the second operational amplifier is configured for outputting the triangle wave voltage signal;

the triangle wave voltage signal and the modulation signal are input to the comparator, an output of the comparator is electrically connected to a gate terminal of the field effect transistor, the first resistor is electrically connected between the power supply and a source terminal of the field effect transistor, and a drain terminal of the field effect transistor outputs a pulse width modulation current signal through the second resistor to a load; and the second operational amplifier, the second current limiting resistor, the capacitor and the back grounding resistor together forming an integrator and the back grounding resistor electrically connecting a positive terminal of the second operational amplifier to ground provide the triangle wave generator with the characteristic that the triangle wave voltage signal output by the output terminal of the second operational amplifier has a plurality of rising portions and a plurality of declining portions, with the triangle wave voltage signal consisting only of odd harmonics such that a percentage of high frequency harmonics of the triangle wave voltage signal is low.

* * * * *